United States Patent [19]

Mori et al.

[11] Patent Number: 5,063,582
[45] Date of Patent: Nov. 5, 1991

[54] LIQUID COOLED X-RAY LITHOGRAPHIC EXPOSURE APPARATUS

[75] Inventors: Tetsuzo Mori, Atsugi; Eiji Sakamoto, Sagamihara; Shinichi Hara, Atsugi; Koji Uda, Yokohama; Isamu Shimoda, Zama; Shunichi Uzawa, Tokyo; Kunitaka Ozawa, Isehara, all of Japan

[73] Assignee: Canon Kabushiki Kaisha, Tokyo, Japan

[21] Appl. No.: 658,434

[22] Filed: Feb. 20, 1991

Related U.S. Application Data

[63] Continuation of Ser. No. 401,653, Aug. 31, 1989, abandoned.

[30] Foreign Application Priority Data

Sep. 2, 1988 [JP] Japan .................. 63-218520
May 30, 1989 [JP] Japan .................. 1-138809

[51] Int. Cl.$^5$ .................. G21K 5/00; G03B 27/52
[52] U.S. Cl. .................. 378/34; 378/35; 378/208; 355/30; 355/53; 250/443.1; 357/82
[58] Field of Search .................. 378/34, 35, 208; 250/443.1, 492.2, 492.21; 357/82, 87; 355/30

[56] References Cited

U.S. PATENT DOCUMENTS

| | | | |
|---|---|---|---|
| 4,037,045 | 7/1977 | Beriger et al. | 357/82 |
| 4,072,188 | 2/1978 | Wilson et al. | 250/443.1 |
| 4,194,233 | 3/1980 | Jones et al. | 361/233 |
| 4,350,026 | 9/1982 | Klein | 357/82 |
| 4,432,635 | 2/1984 | Mayer | 355/30 |
| 4,503,335 | 3/1985 | Takahashi | 355/30 |
| 4,514,636 | 4/1985 | King | 250/443.1 |
| 4,516,253 | 5/1985 | Novak | 378/35 |
| 4,668,077 | 5/1987 | Tanaka | 355/30 |
| 4,704,348 | 11/1987 | Koizumi et al. | 355/30 |
| 4,720,732 | 1/1988 | Tsutsui | 355/30 |
| 4,786,947 | 11/1988 | Kosugi et al. | 355/30 |
| 4,843,563 | 6/1989 | Takahashi et al. | 250/492.2 |

FOREIGN PATENT DOCUMENTS

2362419 3/1978 France .
1534450 12/1978 United Kingdom .

*Primary Examiner*—Edward P. Westin
*Assistant Examiner*—Kim-Kwok Chu
*Attorney, Agent, or Firm*—Fitzpatrick, Cella, Harper & Scinto

[57] ABSTRACT

The present invention relates to a temperature control system for a lithographic exposure apparatus wherein a mask and wafer are closely disposed, and predetermined exposure energy is applied to respective shot areas of the wafer through the mask. The exposure energy is a soft-X-ray source, for example. The pattern of the mask is transferred onto the respective shot areas in a step-and-repeat manner. In the apparatus, a temperature control medium liquid is supplied into the wafer chuck which supports the wafer at the exposure position. The flow rate of the temperature control liquid is different during an exposure operation than during a non-exposure-operation. The flow control is determined in consideration of the wafer chuck vibration attributable to the supply of the liquid medium and also, of the heat generation in the wafer by the exposure energy, so that the vibration of the wafer chuck during the exposure operation is suppressed. Simultaneously the temperature rise of the wafer can also be suppressed. The pattern transfer from the mask to the wafer thus be precisely performed.

17 Claims, 7 Drawing Sheets

LIQUID COOLED X-RAY LITHOGRAPHIC EXPOSURE APPARATUS

This application is a continuation of prior application Ser. No. 07/401,653, filed Aug. 31, 1989, now abandoned.

FIELD OF THE INVENTION AND RELATED ART

The present invention relates to an exposure apparatus wherein a predetermined radiation energy is applied to a wafer through a mask, by which a pattern of the mask is printed on the wafer, and more particularly to an exposure apparatus having a wafer chuck for maintaining the wafer at a predetermined fixed position, equipped with a temperature control system.

In the field of semiconductor device lithography, the exposure of the wafer to a mask pattern is required to be highly precise. Therefore, in the lithographic exposure apparatus, it is known that a temperature control cooling medium flows through the wafer chuck so as to maintain a constant temperature of the wafer during the exposure and to prevent thermal deformation.

However, in the conventional system, the flow rate was constant to suppress the temperature rise resulting from the wafer exposure. When the rate of the cooling medium flows through the passage in the wafer chuck, the wafer chuck and the wafer supporting portion therearound vibrate due to the flow of the medium. The displacement resulting from the as large as several tens $\times 10^{-3}$ microns to several hundreds $\times 10^{-3}$ microns. Such a large vibration during the exposure operation degrades the precision of the pattern formation by the exposure.

On the other hand, if the flow rate is so low as not to influence the precision of the pattern formation, it is not possible to suppress the wafer temperature rise within a tolerable range.

SUMMARY OF THE INVENTION

Accordingly, it is a principal object of the present invention to provide an exposure apparatus a temperature control system by which the temperature rise of the wafer during the exposure can be limited within the tolerable range without degrading the pattern formation precision attributable to vibration stemming from the flow of the cooling medium liquid.

In order to achieve the object, the apparatus of the present invention is provided with flow control means in the medium passage, which is operated in accordance with operation of the exposure apparatus. The control is such that during the exposure operation, the vibration resulting from the flow does not influence the pattern formation precision, and during a non-exposure-operation, the temperature rise is sufficiently absorbed.

These and other objects, features and advantages of the present invention will become more apparent upon consideration of the following description of the preferred embodiments of the present invention taken in conjunction with the accompanying drawings.

DETAILED DESCRIPTION OF THE PREFERRED EMBODIMENTS

Figure 1:
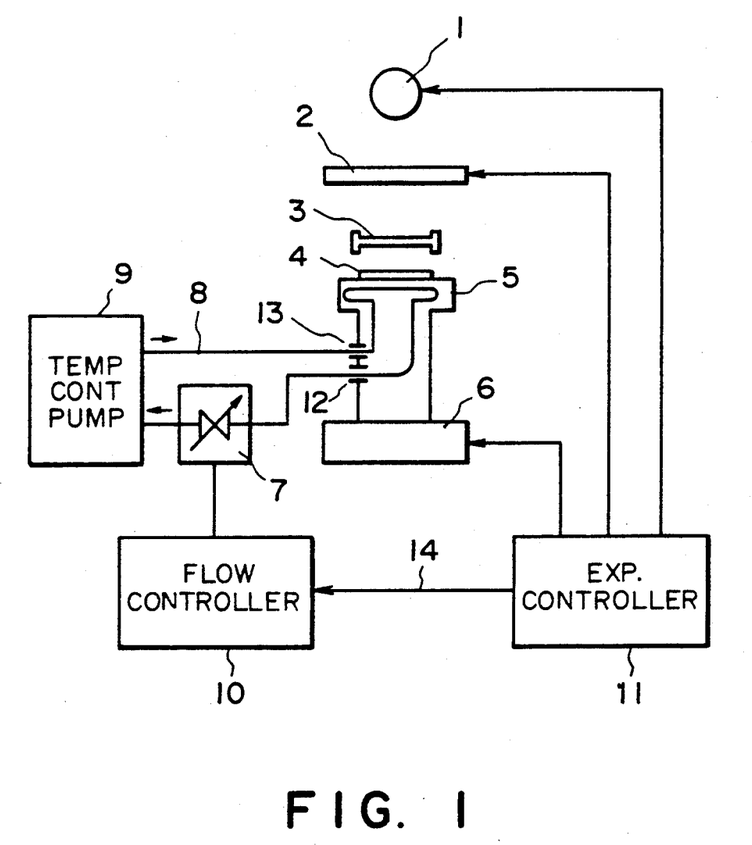
FIG. 1 is a schematic drawing of an exposure apparatus according to one embodiment of the present invention.

Referring to FIG. 1, there is shown an exposure apparatus according to one embodiment of the present invention. The exposure apparatus comprises a radiation source in the form of, for example, an extra-high pressure mercury lamp, an excimer laser source, a soft-X-ray source, or the like, a shutter 2 for controlling the exposure, a wafer chuck 5 for attracting and maintaining, at a predetermined exposure position, a wafer 4 onto which a pattern of a mask is to be exposure-transferred, a positioning stage 6 for moving and positioning the wafer chuck 5 for sequentially aligning the respective shot areas of the wafer 4 relative to the mask 3, a flow control valve 7 for controlling the flow of a temperature controlling medium, a flow passage 8 for flowing the temperature controlling medium for controlling the temperature of the wafer chuck 5, and a temperature controlling pump 8 for circulating the medium. During the exposure operation, the radiation energy from the radiation source 1 is applied onto the wafer 4 through the mask 3. The temperature of the medium is controlled to be constant by an unshown heat exchanger means. The apparatus further comprises a flow controller for controlling the flow controlling valve 7, an exposure controller 11 for supplying control instructions to the radiation source 1, the shutter 2, the stage 6 and the flow controller 10 and others to control the entire apparatus, particularly, in the process of exposure steps, outlet 12 and inlet 13 for the temperature controlling medium in the wafer chuck 5, and a signal line 14 for supplying, from the exposure controller 11 to the flow controller 10, a signal indicative of the operational stage in the exposure sequential operation, and more particularly, whether or not the exposure apparatus is performing the exposure operation.

In operation, the cooling medium is fed out by the pump 9. The temperature of the medium is controlled within the temperature range of 23° C. ±2/100 ° C., and is recirculated. The cooling medium flows through the passage 8 and the inlet 13 into the wafer chuck 5, where it absorbs the heat from the wafer chuck 5 and the wafer 4, and it is discharged through the outlet 12. The discharged medium is returned through the flow control valve 7, and is again temperature-controlled to be 20° C. ±2/100 ° C. Then, the medium repeats the circulation. The exposure controller 11 transmits, through the signal line 14 to the flow controller 10, a signal indicative of whether the apparatus is going to start the exposure operation or is going to end the exposure operation. The flow controller 10 includes a two-rate flow controlling valve 7, the flow rate being switched in accordance with the signal. The flow control valve 7 controls, during the exposure, the flow rate to be A with which the vibration of the wafer chuck 5 is within a tolerable range so as not to influence the pattern formation precision. When the exposure operation is not carried out, the flow is B (A<B), by which the temperature rise resulting from the accumulation of the exposure energy applied to the wafer 4 and the wafer chuck 5 by the previous exposure or exposures is suppressed within a tolerable range. The flow rate A may be zero, but it is preferably not zero, so that a certain degree of the heat is removed from the wafer chuck 5 during the exposure operation, within a limit of the resultant vibration not influencing the pattern formation precision.

Figure 2:
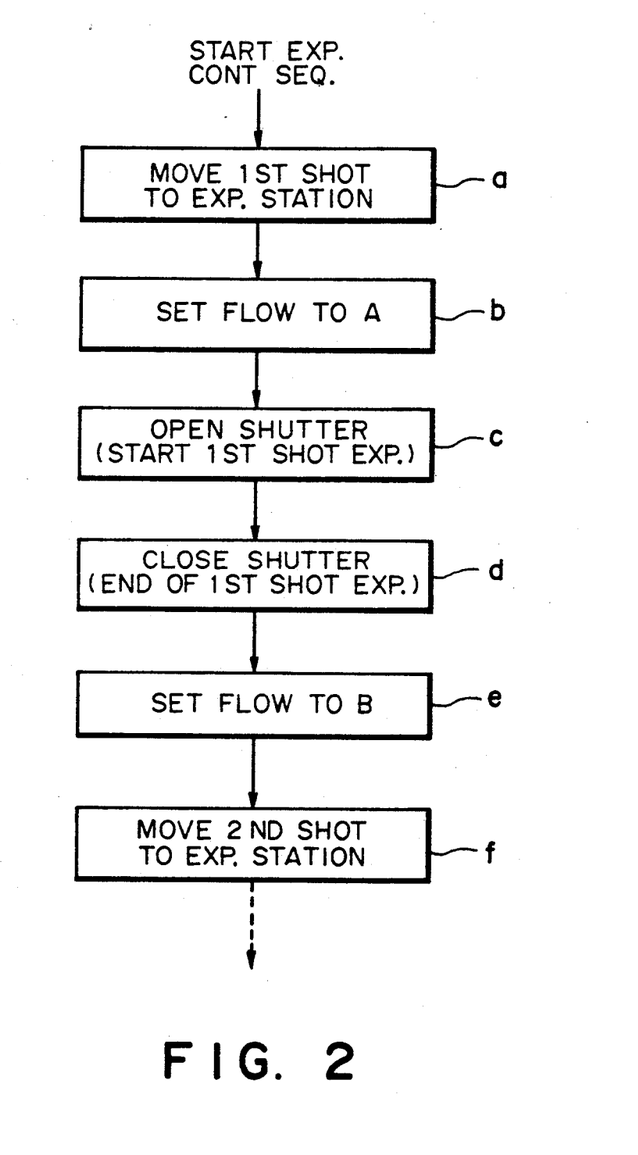
FIG. 2 is a flow chart illustrating an operational sequence of the apparatus of FIG. 1.
Figure 3:
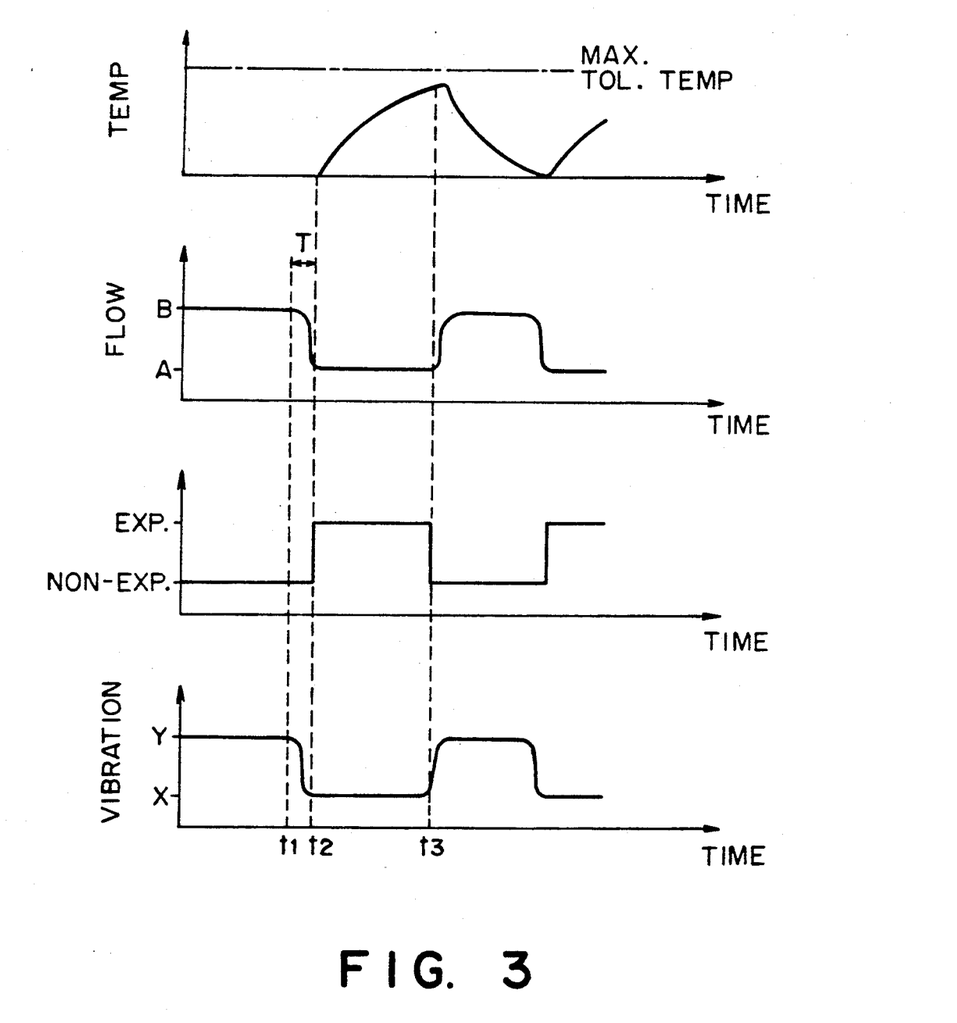
FIG. 3 is a timing chart illustrating operation of the apparatus of the FIG. 1 embodiment.

The exposure controller 11, in accordance with a sequence programmed beforehand, controls the radiation source 1, the opening and closing of the shutter 2 and movement of the positioning stage 6. Referring to FIG. 2, there is shown a flow chart of the exposure operation sequence in the exposure apparatus described above. When the exposure sequence control starts, the exposure controller 11 drives the positioning stage 6 to align a first shot area of the wafer 4 to the exposure position, more particularly, relative to the mask 3 (step a) in order to transfer the pattern of the mask 3 onto the first shot area of the wafer 4 which is already carried and attracted on the wafer chuck 5. As shown in FIG. 3 at the point of time $t_1$, the flow controller 10 sets the degree of opening of the flow controlling valve 7 to change the flow rate from B to A (step b). At a point of time $t_2$ which is time period T after the point of time $t_1$ shown in FIG. 3, the shutter 2 is opened to effect the exposure of the first shot area (step c). After a predetermined period of time elapses or after the predetermined amount of exposure is reached, the shutter 2 closed, by which the first shot area exposure operation is completed at the point of time $t_3$ (step d). Thereafter, the flow controller 10 sets the degree of opening of the flow control valve 7 back to the flow rate B (step e). Subsequently, a second shot area is aligned to the exposure position (step f), and the exposure sequence operation for the second shot area is started. The above-described steps b, c, d and e are repeated; and further, the exposure for a third shot area is similarly controlled.

In FIG. 3, (a)–(d) are timing charts showing the temperature, the flow rate, the stage of exposure and amplitude of the vibration of the exposure apparatus with time. During the exposure operation, the flow rate is low (rate =A) to suppress the vibration (vibration =X) to permit highly precise pattern formation. When the exposure operation is not carried out, the flow rate is increased to B to decrease the temperature. At this time, the vibration becomes large (vibration =Y) due to the increase of the flow rate, but since the exposure operation is not carried out, the pattern forming operation is not influenced.

Figure 4:
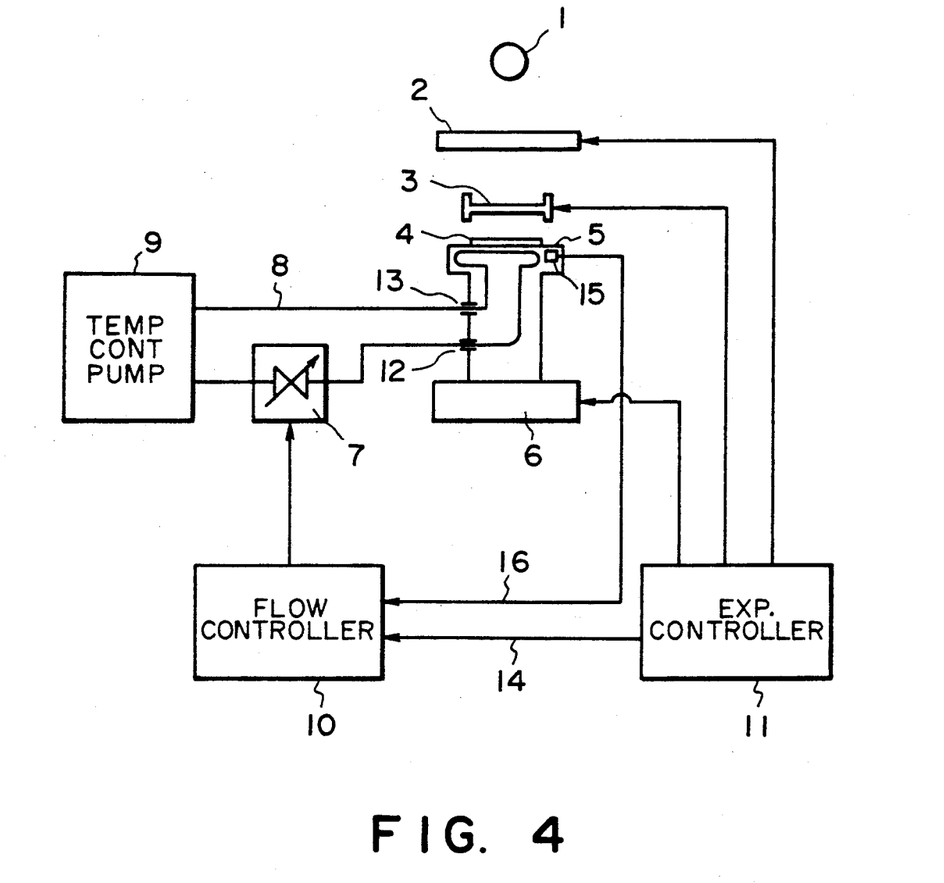
FIG. 4 shows an exposure apparatus according to another embodiment of the present invention.

FIG. 4 shows an apparatus according to another embodiment of the present invention, wherein a temperature sensor 15 for sensing the temperature of the wafer chuck 5 is additionally provided. Also, added is a signal line 16 for transmitting the detected temperature to the flow controller 10. The flow controller 10 is responsive to the temperature of the wafer chuck 5 at the point of time $t_3$, for example, of FIG. 3 which is after the exposure operation to select the degree of the opening of the flow control valve 7 from multi-levels selectable, more particularly, so that the flow rate B during the non-exposure-operation is one of B1, B2 ..., Bn (B1 <B2<...<Bn).

When the temperature of the wafer chuck 5 at the point of time $t_3$ is high, the flow rate is controlled to be Bn to remove a greater amount of heat from the wafer chuck 5, and if the temperature is not so high, the flow rate may be B1, where B1 may be equal to A. If the temperature is between the above two, one of the flow rates B2, B3, ..., B(n−1) is selected in accordance with the level of the detected temperature. In this embodiment, when the flow rate is changed from B to A, it is not necessary to greatly change from Bn to A, for example, and the production of vibration stemming from the change in the flow rate can be minimized, as the case may be. During the exposure operation for some of the shot areas of the wafer 4, the time period T shown in FIG. 3 may be reduced as compared with the case when the flow rate is changed from Bn to A, therefore, it is preferable.

According to this embodiment, a further precise temperature control can be more efficiently accomplished. The structure and operations of the other part of the apparatus are the same as those in the FIG. 1 example.

Figure 5:
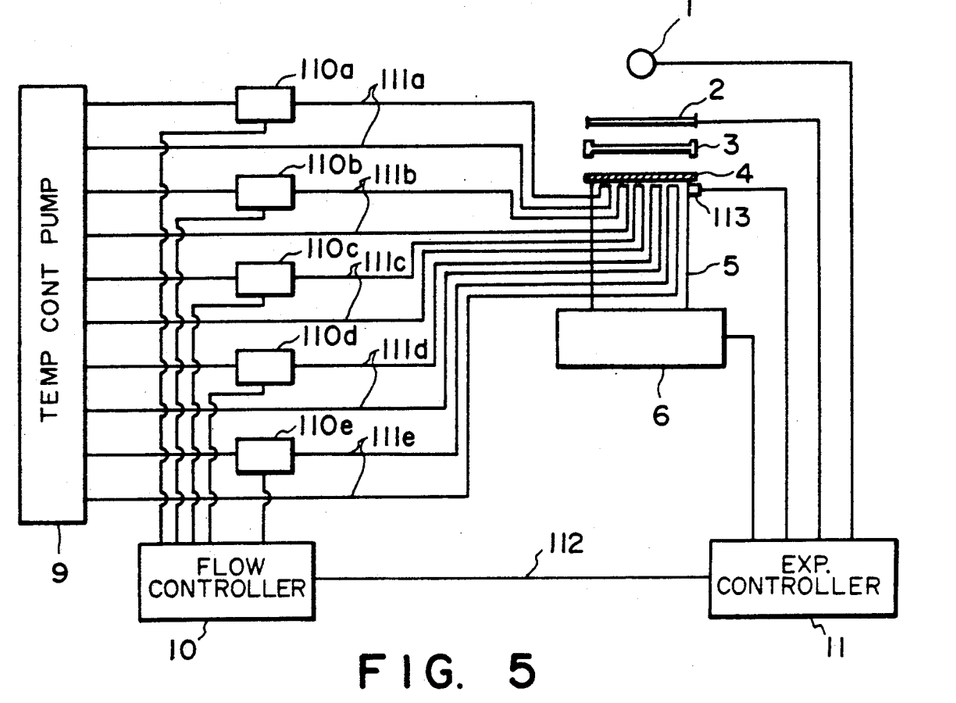
FIG. 5 shows an exposure apparatus according to yet a further embodiment of the present invention.

FIG. 5 shows an exposure apparatus according to a further embodiment of the present invention, wherein the exposure apparatus comprises a radiation source 1 for the exposure, and a shutter 2 for controlling the exposure. Designated by reference numerals 3 and 4 are a mask having a pattern to be transferred and a wafer on which the pattern of the mask 3 is to be transferred. The apparatus further comprises a wafer chuck 5 for attracting the wafer 4 and maintaining it at an unshown exposure position, a positioning stage 6 for sequentially positioning shot areas of the wafer 4 relative to the mask 3, an exposure controller 11 for controlling the exposure process steps, a flow controller 10 for controlling flow control valves 110a–110e, a temperature control pump for circulating the temperature controlling medium and heat exchanger means to control the medium temperature to be constant. They are generally similar to the corresponding elements of the FIG. 1 embodiment, except for those which will be described hereinafter. The flow control valves 110a, 110b, 110c, 110d and 110e control the rate of flow therethrough. The temperature controlling medium flows through pipes 111a, 111b, 111c, 111d and 111e. A signal line 112 is effective to transmit the state of exposure operation or the exposure position from the exposure controller 107 to the flow controller 108. A temperature sensor 113 monitors the temperature of the wafer chuck.

Figure 6:
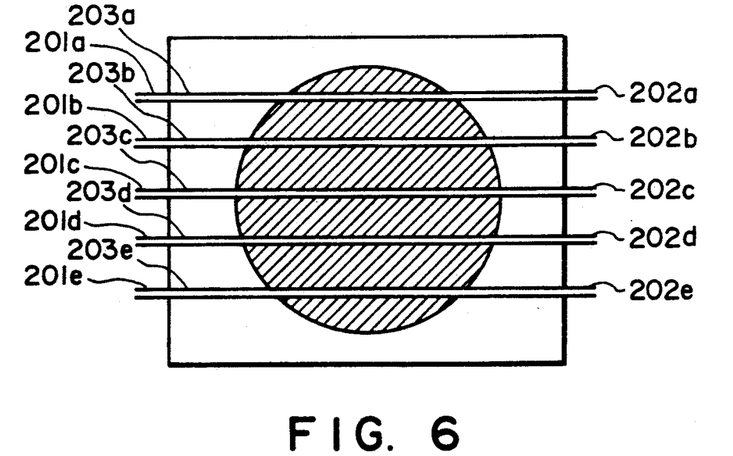
FIG. 6 shows a wafer chuck used in the apparatus the of FIG. 5 embodiment.

FIG. 6 shows details of the wafer chuck 5 used in this embodiment. A flow passage 203a is provided with an inlet 201a communicating with the pipe 111a. Similarly, flow passages 203b–203e are provided with respective inlets 201b–201e communicating with the pipes 111b–111e, respectively. The flow passage 203a is also provided with an outlet 202a. Similarly, the flow passages 203b–203e are provided with outlets 202b–202e, respectively. There are flow passages 203a–203e communicating the pipes 111a–111e.

Figure 7:
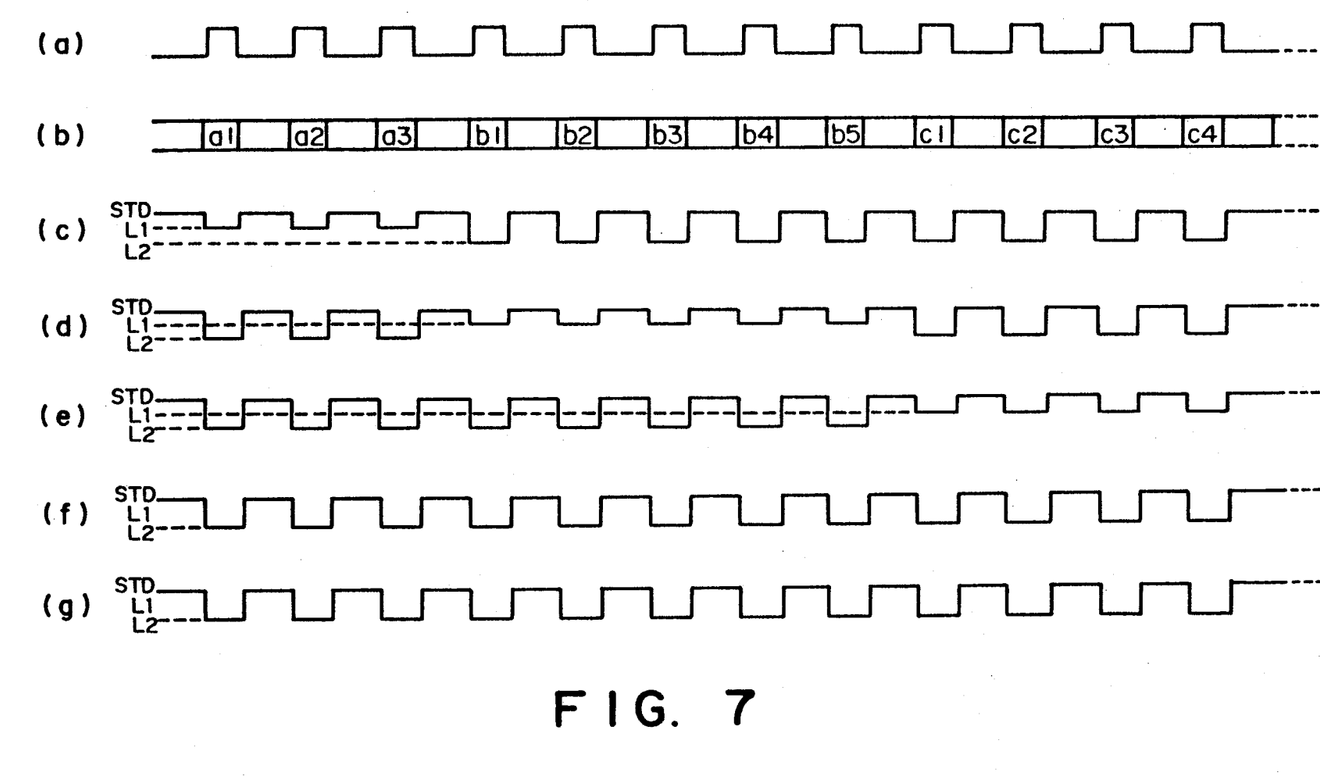
FIG. 7 is a timing chart illustrating operation of the apparatus of FIG. 5.

FIG. 7 is a timing chart illustrating operations of the apparatus of this embodiment. In this chart, reference (a) shows whether the exposure apparatus is performing the exposure operation or not, reference (b) shows the shot area of the wafer surface which is being exposed, and reference (c) shows the flow rate of the temperature controlling medium flowing through the pipe 111a. Similarly, references (d)–(g) designate the flow rates through the pipes 111b-111e. In references (c)-(g) of this FIG., the change of the flow rate is effected, taking the time period T into account, as shown in FIG. 3(b).

Figure 8:
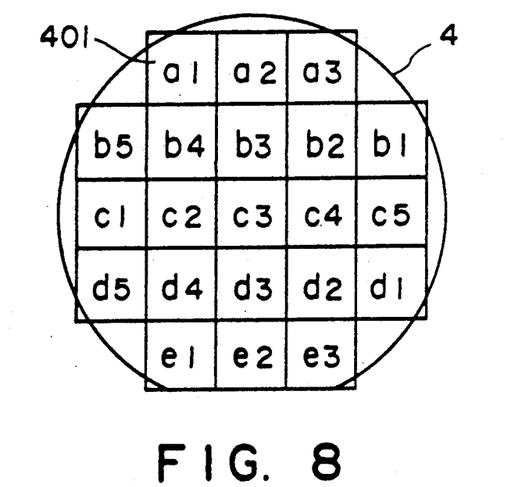
FIG. 8 is a top plan view cf a wafer showing the order of exposure operations.

FIG. 8 shows the order of exposure for the shot areas of the wafer 4 in this embodiment. Reference numeral 401 designates an area which can be exposed by one exposure, while the same applies to the other areas.

In operation, the temperature control medium is fed out of the temperature control pump 109 in FIG. 5. The temperature of the medium is controlled to be within the range of 23° C.+2/100° C. and is circulated repeatedly. The pump 9 supplies the temperature controlling mediums to the five lines of the pipes 111a-111e.

The first line extends from the temperature control pump 9 to the pipe 111a. Through this line, the medium absorbs the heat from the wafer chuck 5 and the wafer 4, and is returned to the temperature control pump through the flow rate control valve 110a, and is again controlled in its temperature to be within the range of 2° C.±2/100 ° C.

Similarly, the second line is constituted by the pipe 111b and the flow rate control valve 110b. Further similarly, the third, fourth and fifth lines are constituted by the pipe 111c and the control valve 110c, by the pipe 110 and the control valve 110d, and by the pipe 111e and the control valve 110e, respectively.

The exposure controller 11, through the signal line 112, supplies the exposure information representing whether the apparatus is going to start the exposure operation or whether it is terminating the exposure operation, and exposure position information representing what shot area of the wafer 4 is being exposed, to the flow controller 10.

The exposure controller 11 has lay-out data representing how the wafer 4 is divided into shot areas. During the exposure operation, it discriminates the exposure shot on the basis of the lay-out data. The exposure information is produced on the basis of the starting and ending signals of the step-movement of the wafer 4 by the stage 6. This can be discriminated on the basis of an ending signal representing the completion of the alignment between the shot area of the wafer 4 and the mask pattern, or on the basis of the starting signal of the shutter 102 operation. In the latter case, however, the flow change by actuation of the valves 110a-110e is to be quickly completed. The flow controller 10 controls the flow rate control valve 110a-110e in accordance with the exposure information and the exposure position information described above, so as to control the rate of the temperature control medium in three stages (STD, L1 and L2 where STD>L1>L2). The exposure controller 11 reads the wafer chuck 5 temperature from the temperature sensor 113 to predict the temperature of the wafer 4. The exposure controller 11 supplies the temperature of the wafer chuck described above or the temperature of the wafer 4 predicted, to the flow controller 10. The flow controller makes a correction of the flow rate from a basic or standard rate STD (FIG. 7) which has been predetermined, in accordance with the temperature information.

On the other hand, the exposure controller 11 operates the positioning stage 6 by an unshown driving mechanism to align a first shot area of the wafer 4 with the mask 3 in order to expose the first shot area of the wafer 4 attracted on the wafer chuck 5 to the pattern of the mask 3. Then, the exposure controller 11 operates an unshown shutter driving mechanism to open the shutter 2 to start the exposure of the first shot area.

After a predetermined period of time elapses, or after the predetermined exposure amount is reached, the shutter 2 is closed to complete the first shot area exposure operation.

Subsequently, the positioning stage 6 is driven to align a second shot area of the wafer 4 relative to the mask 3, and then, similar to the above-described first shot case, the exposure operation is performed. In similar manner, the third and fourth shot areas are sequentially subjected to the aligning and exposure operations until all the shot areas are exposed.

Referring to FIGS. 6 and 7, the temperature control in this embodiment will be described in detail. In FIG. 6, the flow passages 203a-203e formed within the thickness of the wafer chuck 5 are shown. There are five lines of the flow passages 203a-203e, and the respective lines share the cooling of the respective areas of the wafer chuck 5.

More particularly, when it is discriminated, on the basis of the exposure position information supplied from the exposure controller 11, that the currently exposed shot area is above or adjacent the flow passage 203a, the flow controller controls the valve 110a to provide the flow rate L1 in the passage 203a, the flow rate L1 is being the one to be set during the exposure operation being performed. When it is discriminated, on the basis of the exposure information supplied from the exposure controller 10, that the exposure operation is completed, the flow controller 10 sets the flow rate STD for the passage 203a by the valve 110a. The other passages 203b-203e are similarly controlled, if any is adjacent to the currently exposed shot. Here, the flow rate L1 and STD satisfy:

STD>L1.

With the progress of the exposure sequence, the exposure shot comes to, or to the neighborhood of, the flow passage 203e. At this time, the flow rate through the passage 203a becomes L2 during the exposure operation. When the exposure operation is not performed, it is STD.

Here, the flow rates L1, L2 and STD satisfy:
STD>L1>L2.

FIG. 8 shows the order the exposure steps. They are exposed in the order of a1, a2, a3, b1, b2, b3, b4, b5, c1, c2, c3, c4, c5, d1, d2, d3, d4, d5, e1, e2 and e3. This is one example of a typical order, but it is not limiting. In this FIG., the surface of the wafer is shown as being divided into 21 square areas, but this is not limiting, either.

FIG. 7 is a timing chart illustrating the above-described operations. In FIG. 7 at (b), until the alignment for the first shot area A1 is completed, the flow rates of the passages 203a, 203b, 203c, 203d and 203e are all set to the STD. When the alignment for the area a1 is completed, the flow rate of the passage 203a is set to be L1 before the start of the exposure operation for the shot area a1. The flow rates of the other passages 203b-203e are L2. As described hereinbefore, the flow rates L1, L2 and STD satisfy STD>L1>L2, and therefore, the total flow of the medium supplied to the entire wafer chuck 5 is decreasing, and the flow rate of the passage 203a adjacent to the exposed shot area a1 is higher than those of the passages 203b-2033e. Therefore, the vibration of the wafer chuck 5 is decreased, and simultaneously, the temperature rise adjacent to the shot area a1 can be suppressed during the exposure operation to a certain extent. When the exposure of the shot area a1 is completed, the flow rates of all of the passages 203a–203e are returned to be STD, and the alignment operation for the next shot area a2 is started. The flow rate of the passage 203a returns to L1 before the start of the exposure operation of the shot area a2 after the completion of the alignment for the shot area a2. The flow rates of the passages 203b–2003e are again L2. In the similar manner, the exposure operations of the shot areas a2 and a3 are completed, and the flow rates of the passages 203a–203e are at this point of time, STD.

Next, the alignment of the shot area b1 is started. At this time, the flow rate of the passages 203a–203e are all STD.

Since the shot areas b1, b2, b3, b4 and b5 are above or adjacent the passage 203b in FIG. 6, the flow rate of the passage 203b becomes L1 prior to the start of the exposure after completion of the alignment for the shot area b1, and the flow rate of the other passages 203a, 203c –203e are all L2. When the exposure to the shot b1 is completed, the flow rate of all of the flow passages 203a–203e are standard. In the similar manner, the sequential exposure operations are performed.

In this embodiment, the flow rate of the liquid passage facing to the exposure shot area and the flow rate of the passage facing to the other shot areas satisfy STD>L1>L2, when the temperature of the chuck 5 is controlled. However, this is not limiting, and it will suffice if the total flow per unit time of the liquid through the chuck is such that it does not produce the vibration influencing to the exposure operation and such that the heat at the exposure position can be sufficiently removed.

For example, it is a possible alternative that during the exposure operation, the liquid (medium) supply to the position other than the exposure shot area is stopped, whereas the rate of flow which does not result in production of vibration influencing the exposure operation is supplied only to the flow passage corresponding to the exposure shot area. In this case, the relationship is not limited to STD>L2, but STD≦L2 is satisfactory.

Figure 9:
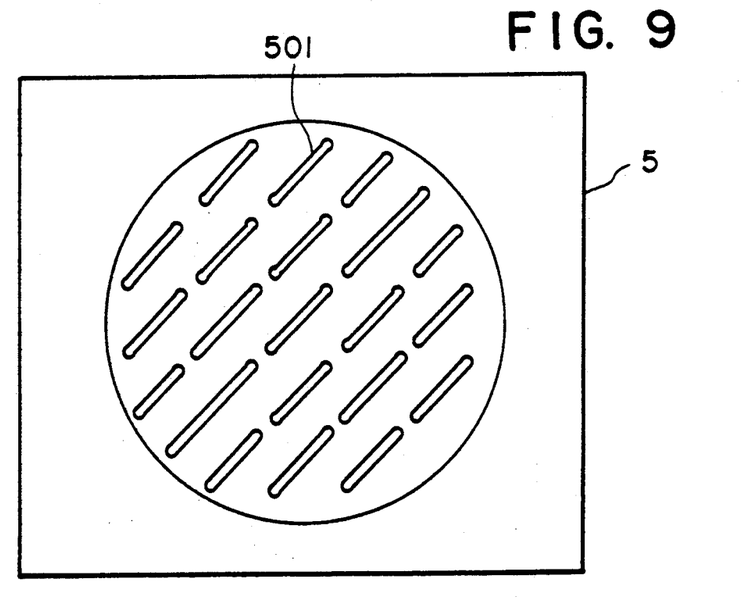
FIG. 9 shows another example of the wafer chuck in a plan view.

FIG. 9 shows an apparatus according to yet a further embodiment of the present invention, wherein the flow passage 501 of the wafer chuck 5 is further finely divided wherein the flow rates of the temperature controlling medium are controlled.

Figure 10:
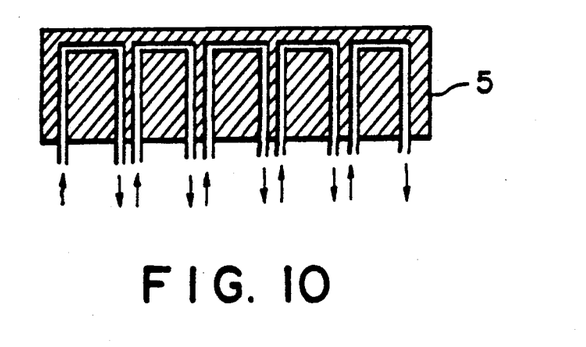
FIG. 10 is a cross-sectional view of the wafer chuck of FIG. 9.

FIG. 10 is a cross-sectional view of the waver chuck of FIG. 9.

As described in the foregoing, according to the present invention, the flow rate control means is provided to control the flow of the temperature controlling medium through the wafer chuck is provided, and therefore, the flow of the medium can be controlled in accordance with the state of the exposure operation. Accordingly, the temperature of the wafer can be maintained within a predetermined tolerable range without reducing the throughput of the exposure process; and the possible degrading of the pattern formation precision due to the vibration stemming from the flow of the medium can be prevented, thus accomplishing high precision patterning.

While the invention has been described with reference to the structures disclosed herein, it is not confined to the details set forth and this application is intended to cover such modifications or changes as may come within the purposes of the improvements or the scope of the following claims.

What is claimed is:

1. A lithographic exposure apparatus, comprising:
a chuck for supporting a member for exposure;
exposure means for exposing the member to exposure energy;
supply means for supplying a temperature controlling medium to said supporting chuck through a medium passage;
flow control means located in said passage; and
control means for controlling said flow control means to provide differing flow rates of the medium supplied to said chuck between a time when the member is exposed to the exposure energy and a time when the member is not exposed thereto, such that the flow rate is less when the member is being exposed than when the member is not being exposed.

2. An apparatus according to claim 1, wherein said control means comprises a temperature detector for detecting temperature of the chuck, and said control means controls said flow rate control means in accordance with an output of said temperature detector.

3. An apparatus according to claim 1, wherein said control means comprises means for changing the rate of flow when the member is not being exposed.

4. A lithographic exposure apparatus, comprising:
a chuck for supporting a member for exposure;
exposure means for exposing respective ones of a plurality of shot areas of the member to exposure energy;
a movable stage for moving said chuck for the sequential exposures of the plurality of shot areas;
supply means for supplying a temperature control medium to said chuck through a plurality of passages;
flow rate control means located in the respective passages; and
control means for controlling said flow rate control means to provide differing flow rates of the medium to said chuck between a time when the member is exposed to the exposure energy and a time when the member is not exposed thereto, wherein said control means comprises means for controlling said flow rate control means such that a total flow of the medium to the chuck through all passages is less when the member is being exposed than that when the member is not being exposed, and wherein, when the member is being exposed, the flow rate or rates though the passage or passages for the shot area being exposed and adjacent thereto is higher than that through the other passages.

5. An apparatus according to claim 4, wherein said control means comprises a temperature detector for detecting a temperature of said chuck, and said control means controls said flow rate control means in accordance with an output of said detecting means.

6. An apparatus according to claim 4, wherein said control means comprises means for changing the rate of flow when the member is not being exposed.

7. An apparatus according to claim 1 or 4, wherein the differing flow rates are determined so that vibration of said chuck is less when the member is being exposed than when the member is not being exposed, and so that any temperature rise of said chuck due to the exposure energy is suppressed.

8. A lithographic exposure method, comprising:
supporting a substrate having a plurality of shot areas on a chuck;
sequentially exposing the shot areas with exposure energy in a step-and-repeat manner while moving the chuck; and
supplying liquid to a passage for removing heat from the chuck at a first rate when the substrate is being exposed to the energy and at a second rate when the substrate is not being exposed to the energy, such that the first rate is less than the second rate.

9. An exposure method according to claim 8, further comprising changing the rate between the first rate and the second rate when the substrate is not being exposed to the energy.

10. A lithographic exposure method, comprising:
supporting a substrate having a plurality of shot areas on a chuck;
sequentially exposing the shot areas with exposure energy in a step-and-repeat manner while moving the chuck; and
supplying liquid to a plurality of passages for removing heat from the chuck at a first rate when the substrate is being exposed to the exposure energy and at a second rate when the substrate is not being exposed to the exposure energy, such that the total of the first rates through the passages is less than the total of the second rates though the passages.

11. An exposure method according to claim 10, further comprising changing the rate between the first rate and the second rate when the substrate is not being exposed to the exposure energy.

12. An apparatus according to claim 4, wherein the differing flow rates are determined so that vibration of said chuck is less when the member is being exposed than when the member is not being exposed, and so that any temperature rise of said chuck due to the exposure energy is suppressed.

13. A semiconductor device manufacturing method, comprising:
supporting on a chuck a wafer having a plurality of shot areas;
exposing the shot areas of the waver with an exposure beam in a step-and-repeat manner;
supplying liquid into a liquid passage to remove from the chuck heat produced by the exposure beam;
wherein a flow rate of the liquid is less when the wafer is being exposed to the exposure beam than when the wafer is not being exposed.

14. A method according to claim 13, further comprising changing the flow rate of the liquid when the wafer is not being exposed to the exposure beam.

15. A semiconductor device manufacturing method, comprising:
supporting on a chuck a wafer having a plurality of shot areas;
exposing the shot areas of the wafer with an exposure beam in a step-and-repeat manner;
supplying liquid into a plurality of liquid passages to remove from the chuck heat produced by the exposure beam;
wherein a total flow rate of liquid in the plurality of passages is less when the wafer is being exposed to the exposure beam than when the wafer is not being exposed.

16. A method according to claim 15, further comprising changing the flow rate of the liquid when the wafer is not being exposed to the exposure beam.

17. A method according too claim 15, wherein a flow rate in one of the liquid passages differs from a flow rate in another one of the liquid passages.

* * * * *

UNITED STATES PATENT AND TRADEMARK OFFICE
CERTIFICATE OF CORRECTION

PATENT NO. : 5,063,582

DATED : November 5, 1991

INVENTOR(S) : Tetsuzo Mori, et al.

It is certified that error appears in the above-identified patent and that said Letters Patent is hereby corrected as shown below:

ON THE COVER PAGE

IN THE ABSTRACT

Line 18, "Simultaneously" should read --Simultaneously,--; and
Line 20, "wafer thus" should read --wafer can thus--.

COLUMN 1

Line 27, "the rate" should read --the prescribed flow rate--;
Line 31, "the as" should read --the vibration is as--; and
Line 43, "apparatus a" should read --apparatus equipped with a--.

COLUMN 3

Line 36, "closed," should read --is closed,--.

UNITED STATES PATENT AND TRADEMARK OFFICE
CERTIFICATE OF CORRECTION

PATENT NO. : 5,063,582
DATED : November 5, 1991
INVENTOR(S) : Tetsuzo Mori, et al.

It is certified that error appears in the above-identified patent and that said Letters Patent is hereby corrected as shown below:

COLUMN 5

Line 11, "+2/100°C" should read --$\pm$ 2/100°C--; and
Line 19, "2 °C" should read --23°C--.

COLUMN 6

Line 46, "order the" should read --order of the--.

COLUMN 7

Line 32, "the" should be deleted;
Line 33, "influenting to the" should read --influencing the--; and
Line 50, "waver chuck" should read --wafer chuck--.

COLUMN 10

Line 7, "waver" should read --wafer--; and

UNITED STATES PATENT AND TRADEMARK OFFICE
CERTIFICATE OF CORRECTION

PATENT NO. : 5,063,582

DATED : November 5, 1991

INVENTOR(S) : Tetsuzo Mori, et al.

It is certified that error appears in the above-identified patent and that said Letters Patent is hereby corrected as shown below:

Column 10, line 33, "too" should read --to--.

Signed and Sealed this

Thirteenth Day of April, 1993

Attest:

*Attesting Officer*

STEPHEN G. KUNIN

*Acting Commissioner of Patents and Trademarks*